(12) United States Patent
Huang et al.

(10) Patent No.: US 8,486,781 B2
(45) Date of Patent: Jul. 16, 2013

(54) METHOD OF MANUFACTURING FLASH MEMORY DEVICE

(75) Inventors: Chih-Jen Huang, Hsinchu (TW); Chien-Hung Chen, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 572 days.

(21) Appl. No.: 12/755,418

(22) Filed: Apr. 7, 2010

(65) Prior Publication Data
US 2011/0250727 A1 Oct. 13, 2011

(51) Int. Cl.
*H01L 21/336* (2006.01)

(52) U.S. Cl.
USPC ........... 438/257; 438/287; 438/514; 438/530; 438/591; 438/593; 438/595

(58) Field of Classification Search
None
See application file for complete search history.

(56) References Cited

U.S. PATENT DOCUMENTS

| | | | |
|---|---|---|---|
| 5,972,751 A * | 10/1999 | Ramsbey et al. | 438/257 |
| 6,146,946 A * | 11/2000 | Wang et al. | 438/264 |
| 6,232,187 B1 * | 5/2001 | Kuroi et al. | 438/287 |
| 6,252,276 B1 * | 6/2001 | Ramsbey et al. | 257/321 |
| 6,294,430 B1 * | 9/2001 | Fastow et al. | 438/264 |
| 6,620,714 B2 * | 9/2003 | Su et al. | 438/585 |
| 6,777,281 B1 * | 8/2004 | Kadosh et al. | 438/199 |
| 6,900,096 B2 * | 5/2005 | Dong et al. | 438/257 |
| 6,943,098 B2 * | 9/2005 | Yeh et al. | 438/525 |
| 6,989,319 B1 * | 1/2006 | Ramsbey et al. | 438/520 |
| 7,176,522 B2 | 2/2007 | Cheng | |
| 7,183,143 B2 * | 2/2007 | Wang | 438/149 |
| 7,259,435 B2 * | 8/2007 | Wang | 257/410 |
| 7,314,812 B2 * | 1/2008 | Wang | 438/510 |
| 7,968,954 B2 * | 6/2011 | Wang | 257/412 |
| 2003/0119255 A1 * | 6/2003 | Dong et al. | 438/257 |
| 2003/0134461 A1 * | 7/2003 | Su et al. | 438/197 |
| 2005/0048746 A1 * | 3/2005 | Wang | 438/528 |
| 2005/0062114 A1 * | 3/2005 | Wang | 257/410 |
| 2005/0227496 A1 | 10/2005 | Park | |
| 2007/0222002 A1 * | 9/2007 | Wang | 257/410 |
| 2011/0250727 A1 * | 10/2011 | Huang et al. | 438/264 |

* cited by examiner

*Primary Examiner* — David E Graybill
(74) *Attorney, Agent, or Firm* — Winston Hsu; Scott Margo

(57) ABSTRACT

A method of manufacturing flash memory device is provided and includes the following steps. First, a substrate is provided. Then, a stacked gate structure is formed on the substrate. Subsequently, a first oxide layer is formed on the stacked gate structure. Following that, a nitride spacer is formed on the first oxide layer, wherein a nitrogen atom-introducing treatment is performed after the forming of the first oxide layer and before the forming of the nitride spacer. Accordingly, the nitrogen atom-introducing treatment of the presentation invention can improve the data retention reliability of the flash memory device.

17 Claims, 4 Drawing Sheets

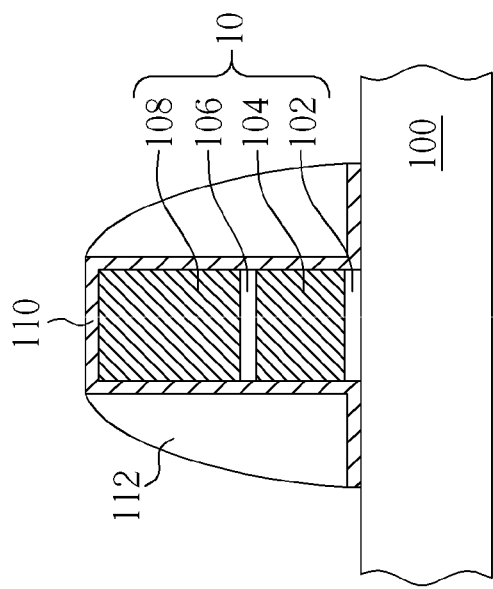
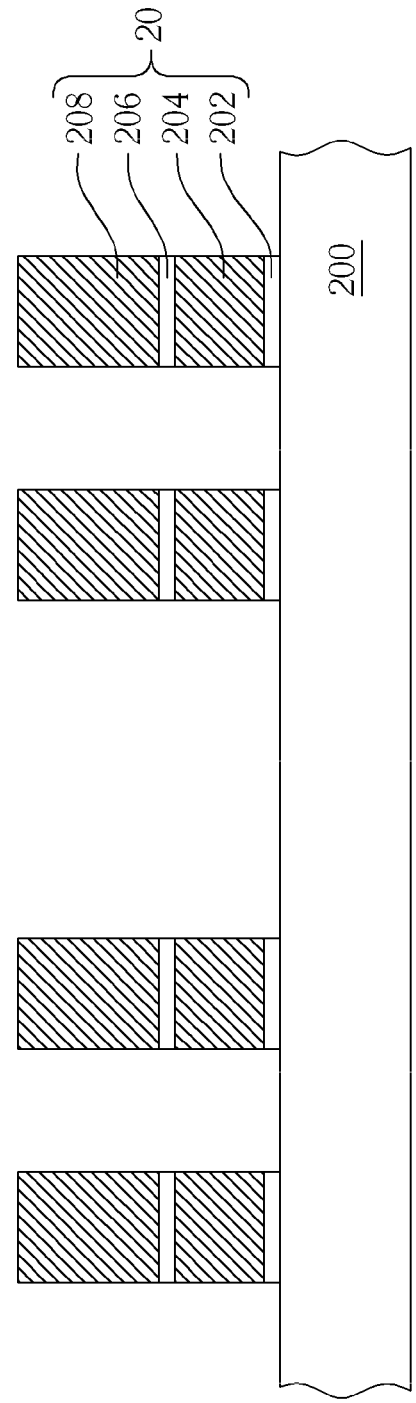
FIG. 1 PRIOR ART
FIG. 2

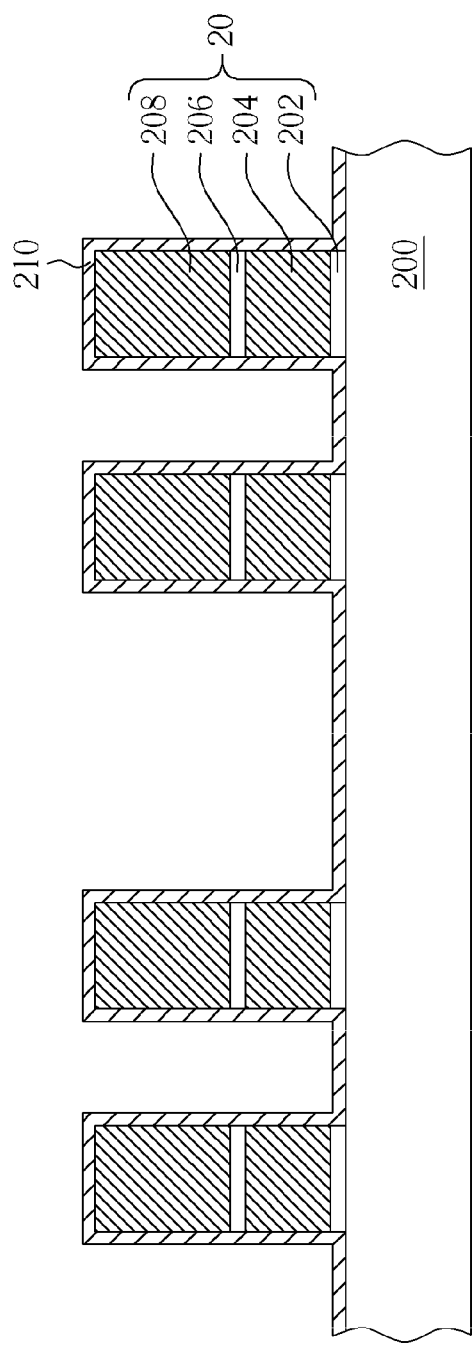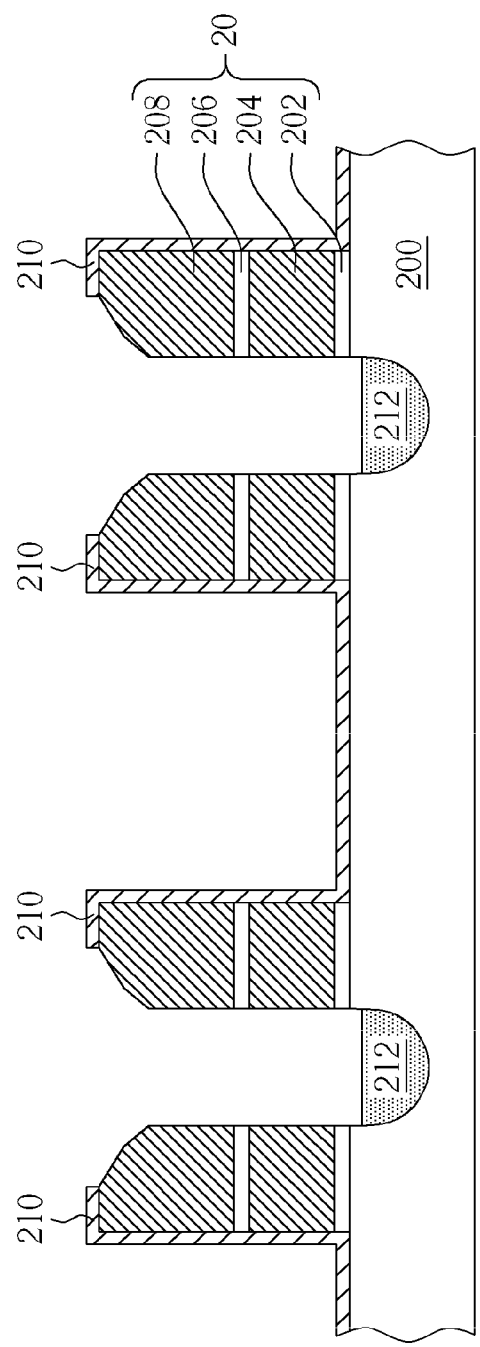

METHOD OF MANUFACTURING FLASH MEMORY DEVICE

BACKGROUND OF THE INVENTION

1. Field of the Invention

The present invention relates to a method of manufacturing a semiconductor device, and more particularly, to a method of manufacturing a flash memory device by performing a nitrogen atom-introducing treatment to improve the data retention reliability of the flash memory device.

2. Description of the Prior Art

Flash memory devices are capable of writing, rewriting, and electrically erasing data in memory cells. In addition, data stored in the flash memory device persists even when power is turned off. This persistent characteristic makes the flash memory devices useful for data storage in applications such as mobile phones, digital cameras, video players, or personal digital assistants (PDA).

Please refer to FIG. 1. FIG. 1 is a schematic cross-sectional view illustrating a flash memory device in the prior art. As shown in FIG. 1, the flash memory device in the prior art includes a stacked gate structure 100 disposed on a substrate 100. The stacked gate structure 10 sequentially includes a tunnel dielectric layer 102, a floating gate 104, an inter-gate dielectric layer 106, and a control gate 108. In addition, in order to enhance the data retention reliability of the flash memory device, the flash memory device usually further includes a linear oxide layer 110 and a nitride spacer 112.

However, the higher the memory capacity is, the higher the integration degree of the flash memory devices should be, such that the thickness of the linear oxide layer 110 and the thickness of the nitride spacer 112 are unavoidably limited. As the feature size of the flash memory device decreases, the flash memory device becomes weaker in the important characteristics, such as high temperature operating life (HTOL). Therefore, the method of manufacturing the flash memory device requires improvement to enhance the integration degree and the data retention reliability at the same time.

SUMMARY OF THE INVENTION

It is therefore one of the objectives of the present invention to provide a method of manufacturing a flash memory device to solve the problems in the prior art.

According to a preferred embodiment of the present invention, a method of manufacturing a flash memory device is provided. The method includes the following steps. First, a substrate is provided. Then, a stacked gate structure is formed on the substrate. Subsequently, a first oxide layer is formed on the stacked gate structure. Following that, a nitride spacer is formed on the first oxide layer, wherein a nitrogen atom-introducing treatment is performed after the forming of the first oxide layer and before the forming of the nitride spacer.

In the method of manufacturing the flash memory device of the present invention, a nitrogen atom-introducing treatment is performed after the forming of the first oxide layer and before the forming of the nitride spacer. Accordingly, the nitrogen atom-introducing treatment of the presentation invention can improve the data retention reliability of the flash memory device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a schematic cross-sectional view illustrating a flash memory device in the prior art.

FIGS. 2-7 are schematic diagrams illustrating a method of manufacturing a flash memory device according to a first preferred embodiment of the present invention.

DETAILED DESCRIPTION

Figure 5:
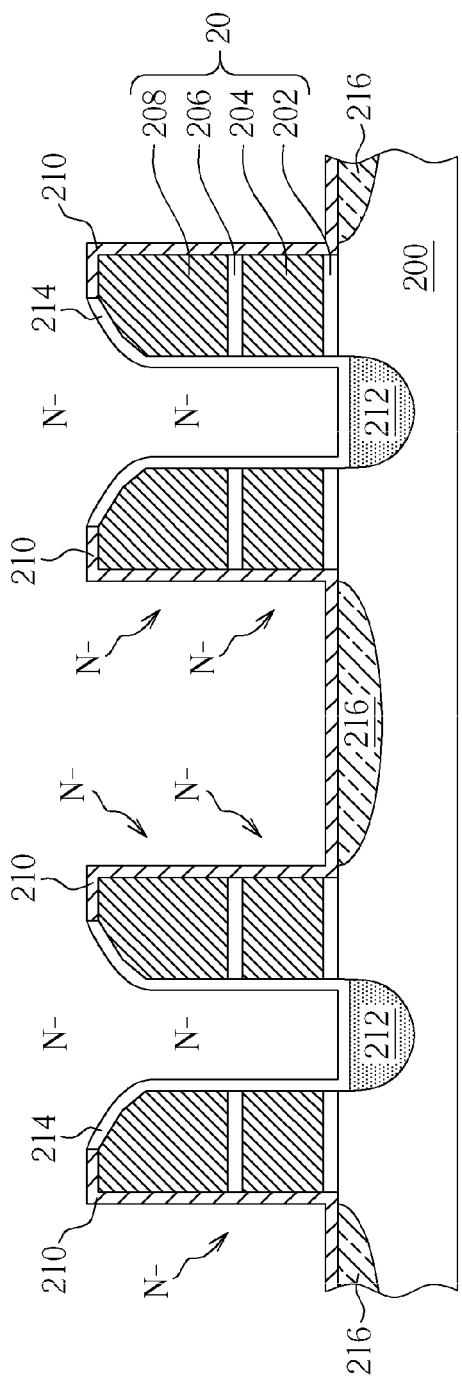

In the following specifications and claims, certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to".

Please refer to FIGS. 2-7. FIGS. 2-7 are schematic diagrams illustrating a method of manufacturing a flash memory device according to a first preferred embodiment of the present invention, wherein the same component or the same region is indicated as the same symbol. It should be noted that the diagrams are for explanations and are not drawn as original sizes or to scale. In the first preferred embodiment, as shown in FIG. 2, a substrate 200 is first provided. In this preferred embodiment, the substrate 200 is a semiconductor substrate, such as a silicon substrate, a silicon-containing substrate, or a silicon-on-insulator (SOI) substrate. But the substrate 200 is not limited herein and can be formed by other suitable materials. Then, at least an insulating region, such as a shallow trench isolation (STI) region (not shown in the figure), can be formed in the substrate 200 to isolate different components. Subsequently, at least a stacked gate structure 20 is formed on the substrate 200. The stacked gate structure 20 sequentially includes a tunnel dielectric layer 202, a floating gate 204, an inter-gate dielectric layer 206, and a control gate 208, but it is not limited herein. The material of the tunnel dielectric layer 202 can be silicon oxide or another suitable material, and the forming method can be a thermal oxidation process, or a chemical vapor deposition (CVD) process, or another appropriate process. The materials of the floating gate 204 and the control gate 208 can be a conductive material, such as a doped polysilicon formed by an ion implantation or by a chemical vapor deposition process with in-situ doping. The inter-gate dielectric layer 206 can be a multi-layer structure (not shown in the figure). For example, the multi-layer structure with an oxide-nitride-oxide (ONO) structure can be formed as follows. An oxide layer is first formed by a thermal oxidation process, and a nitride layer and another oxide layer are formed by a chemical vapor deposition process. Moreover, a plurality of patterned masks (not shown in the figure) can be utilized in the aforementioned process to define the location of each layer of the stacked gate structure 20. However, the stacked gate structure 20 of the present invention is not limited to the aforementioned embodiment. For example, the stacked gate structure 20 can be a silicon-oxide-nitride-oxide-silicon (SONOS) structure (not shown in the figure). More specifically, the stacked gate structure with SONOS structure is formed on a silicon semiconductor layer, and the stacked gate structure sequentially includes an oxide layer, a nitride layer, an oxide layer, and a silicon control gate.

Subsequently, as shown in FIG. 3, a first oxide layer 210 is formed on the stacked gate structure 20. The first oxide layer 210 can be formed by a thermal oxidation process, but it is not limited herein, For example, the first oxide layer 210 can be formed by a chemical vapor deposition process. As shown in FIG. 4, after the forming of the first oxide layer 210, at least a source region 212 is formed in the substrate 200. The method of forming the source region 212 can include the following steps. First, a patterned mask (not shown in the figure) is disposed on the first oxide layer 210. Then, a self-aligned-source etch (SAS etch) process is performed on the first oxide layer to uncover an exposed portion of the substrate 200. Subsequently, a source implantation process is performed to form the source region in the exposed portion of the substrate. After the source implantation process, the patterned mask is removed. But the method of forming the source region 212 is not limited herein and can be another suitable process. It should be noted that in the self-aligned-source etch process, a portion of the first oxide layer 210 and a portion of the control gate 208 may be etched and be removed, and the exposed surface of the substrate 200 in the etch process may also be etched and be removed. As shown in FIG. 5, after the forming of the source region 212, a thermal treatment can be selectively performed to form a second oxide layer 214 on the substrate 200 and on the stacked gate structure 20 for repairing the damage caused by the self-aligned-source etch process. Furthermore, the second oxide layer 214 of the present embodiment can be formed by a thermal oxidation process, but it is not limited herein. For example, the second oxide layer 214 can be formed by a chemical vapor deposition process. Since a lightly doped drain (LDD) process is performed after the forming of the second oxide layer 214, the second oxide layer 214 can also be regarded as a pre-LDD oxide layer. Then, at least a lightly doped drain 216 is formed in the substrate 200 by the lightly doped drain process.

Figure 6:
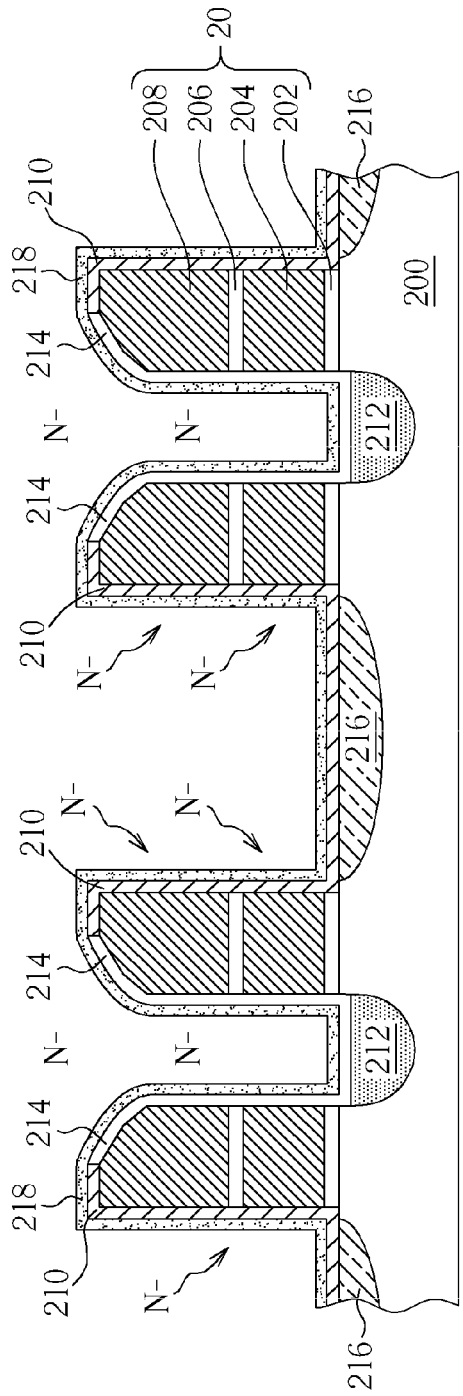

Following that, as shown in FIG. 6, after finishing the lightly doped drain process, a buffer oxide layer 218 is selectively formed on the substrate 200 and on the stacked gate structure 20. Subsequently, a nitrogen atom-introducing treatment is performed, and the nitrogen atom-introducing treatment is a thermal treatment process. A nitrogen-containing gas is utilized in the nitrogen atom-introducing treatment, such as nitrogen. More specifically, the nitrogen-containing gas of the present invention can be only nitrogen. In the present preferred embodiment, the nitrogen-containing gas includes carbon monoxide and nitrogen, and the process recipe of the nitrogen atom-introducing treatment can be as follows: the temperature is preferably between 650° and 700°, the flow rate of carbon monoxide is preferably between 0.5standard liter per minute (SLM) and 1 SLM, the flow rate of nitrogen is preferably between 17 SLM and 20 SLM, and the flow ratio of carbon monoxide to nitrogen is substantially between 0.02 and 0.6. But the nitrogen atom-introducing treatment of the present invention is not limited herein. For example, the gas utilized in the nitrogen atom-introducing treatment can be another appropriate combination, or the nitrogen atom-introducing treatment can be a plasma treatment, and so on. The present invention utilizes the nitrogen atom-introducing treatment to heal the process damage and to change Si—H bonding having a weaker bonding ability into the Si—N bonding having a stronger bonding ability. Therefore, the defects resulted from the broken bonding can be reduced in a subsequent process and during the operation of the flash memory device, and the occurrence of an electron trap phenomenon can be accordingly reduced. Furthermore, the nitrogen atom-introducing treatment of this preferred embodiment can utilize the temperature recipe of the thermal treatment to strengthen the abilities of repairing and bonding modification. As a result, the nitrogen atom-introducing treatment of the present invention can improve the characteristics of the flash memory device, such as increasing the high temperature operating life, reducing the data retention failure, and so on. It should be noted that no additional layer is required in the present invention. Thus, the data retention reliability and the integration degree of the flash memory device can be enhanced at the same time.

In addition, after the nitrogen atom-introducing treatment, an oxidation process can be selectively performed. The oxidation process can be a thermal treatment and a gas utilized in the oxidation process can include oxygen and nitrogen. In this preferred embodiment, the temperature of oxidation process is substantially preferably between 800° C. and 850° C., and the flow rate of oxygen to nitrogen is substantially the same with the conventional recipe. But the recipe of the oxidation process is not limited herein.

Figure 7:
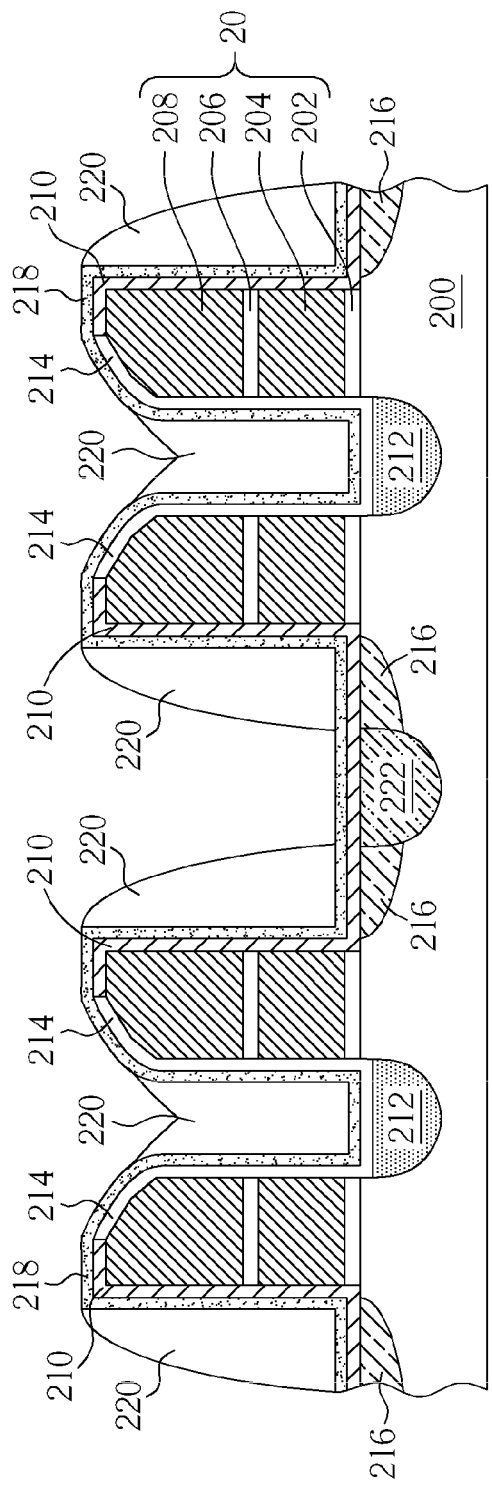

Then, as shown in FIG. 7, at least a nitride spacer 220 is formed on the first oxide layer 210 around the stacked gate structure 20. In this preferred embodiment, the forming of the nitride spacer 220 can include the following two steps. First, a nitride layer (not shown in the figure) is completely deposited on the substrate 200. Then, the nitride layer is etched to form the nitride spacer 220. But it is not limited herein. Accordingly, in the flash memory device of the first preferred embodiment, the layers around the stacked gate structure 20 sequentially include the first oxide layer 210, the second oxide layer 214, the buffer oxide layer 218, and the nitride spacer 220, and it should be noted that the second oxide layer 214 and the buffer oxide layer 218 are selective. Subsequently, a heavily doped drain process is performed in the substrate 200 to form at least a heavily doped drain 222 corresponding to the lightly doped drain 216. The location of the source region 212 will not be influenced due to the coverage of the nitride spacer 220. Therefore, when the heavily doped drain process is performed completely on the substrate 200, the heavily doped drain 222 can be formed in the region without the coverage of the stacked gate structure 20 and the nitride spacer 220, and the heavily doped drain 222 corresponds to the lightly doped drain 216. At this point, the flash memory device of the first preferred embodiment has been formed.

Figure 8:
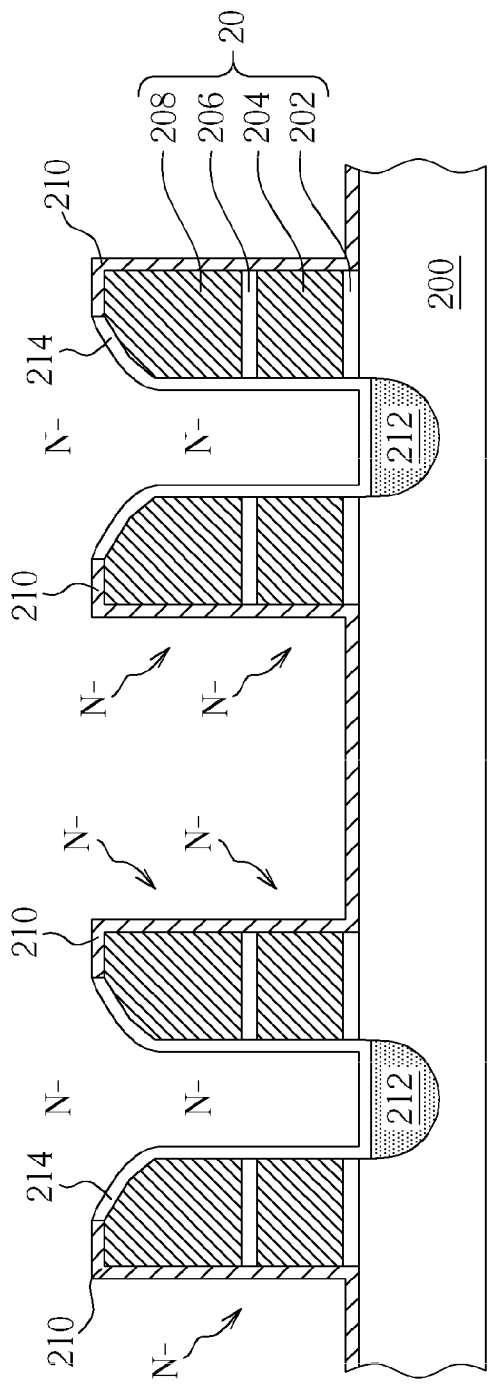
FIG. 8 is a schematic diagram illustrating a method of manufacturing a flash memory device according to a second preferred embodiment of the present invention.

It should be noted that the nitrogen atom-introducing treatment of the flash memory device of the present invention can be performed in another stage and will be illustrated with a second preferred embodiment as follows. To simplify the description and for the convenience of comparison, only the differences between the second embodiment and the first embodiment are illustrated, and identical elements are denoted by identical numerals. Please refer to FIG. 8. FIG. 8 is a schematic diagram illustrating a method of manufacturing a flash memory device according to a second preferred embodiment of the present invention. As shown in FIG. 8, the nitrogen atom-introducing treatment is performed after the forming of the second oxide layer 214 and before the performing of the lightly doped drain process. Accordingly, the nitrogen atom-introducing treatment of the present embodiment can improve the characteristics of the flash memory device, such as increasing the high temperature operating life, reducing the data retention failure, and so on. Hence, the data retention reliability of the flash memory device can be increased. In the second preferred embodiment, other steps of the forming method are the same with that of the first preferred embodiment. Thus, repeated descriptions are not redundantly given.

In summary, in the method of manufacturing the flash memory device of the present invention, a nitrogen atom-introducing treatment is performed after the forming of the first oxide layer and before the forming of the nitride spacer, such as after the forming of the second oxide layer and before the performing of the lightly doped drain process, or after the forming of the buffer oxide layer and before the forming of the nitride spacer. Through the nitrogen atom-introducing treatment, the characteristics of the flash memory device of the present invention can be improved, such as increasing the high temperature operating life, reducing the data retention failure, and so on. In addition, no additional layer is required in the present invention. Thus, the data retention reliability and the integration degree of the flash memory device can be enhanced at the same time.

Those skilled in the art will readily observe that numerous modifications and alterations of the device and method may be made while retaining the teachings of the invention.

What is claimed is:

1. A method of manufacturing a flash memory device, comprising:
    providing a substrate, the substrate comprising a semiconductor substrate;
    forming a stacked gate structure on the substrate;
    forming a first oxide layer on the stacked gate structure;
    after the forming of the first oxide layer, forming a source region in the substrate,
        wherein steps of forming the source region comprise:
        performing a self-aligned-source etch (SAS etch) process on the first oxide layer to uncover an exposed portion of the substrate; and
        performing a source implantation process to form the source region in the exposed portion of the substrate; and
    after the forming of the source region, forming a nitride spacer around the stacked gate structure, wherein a nitrogen atom-introducing treatment is performed after the forming of the first oxide layer and before the forming of the nitride spacer.

2. The method of manufacturing the flash memory device of claim 1,
    wherein the stacked gate structure sequentially comprises:
    a tunnel dielectric layer;
    a floating gate;
    an inter-gate dielectric layer; and
    a control gate.

3. The method of manufacturing the flash memory device of claim 1, wherein after the forming of the source region and before the forming of the nitride spacer, the method further comprises forming a second oxide layer on the stacked gate structure.

4. The method of manufacturing the flash memory device of claim 3, wherein after the forming of the second oxide layer and before the forming of the nitride spacer, the method further comprises performing a lightly doped drain (LDD) process in the substrate.

5. The method of manufacturing the flash memory device of claim 4, wherein the nitrogen atom-introducing treatment is performed after the forming of the second oxide layer and before the performing of the lightly doped drain process.

6. The method of manufacturing the flash memory device of claim 4, wherein after the performing of the lightly doped drain process and before the forming of the nitride spacer, the method further comprises forming a buffer oxide layer on the stacked gate structure.

7. The method of manufacturing the flash memory device of claim 6, wherein the nitrogen atom-introducing treatment is performed after the forming of the buffer oxide layer and before the forming of the nitride spacer.

8. The method of manufacturing the flash memory device of claim 1, wherein steps of forming the nitride spacer comprise:
    depositing a nitride layer; and
    etching the nitride layer to form the nitride spacer.

9. The method of manufacturing the flash memory device of claim 1, wherein after the forming of the nitride spacer, the method further comprises performing a heavily doped drain process in the substrate.

10. The method of manufacturing the flash memory device of claim 1, wherein the nitrogen atom-introducing treatment is a thermal treatment.

11. The method of manufacturing the flash memory device of claim 10, wherein a temperature of the nitrogen atom-introducing treatment is between 650° C. and 700° C.

12. The method of manufacturing the flash memory device of claim 1, wherein a nitrogen-containing gas is utilized in the nitrogen atom-introducing treatment.

13. The method of manufacturing the flash memory device of claim 12, wherein the nitrogen-containing gas comprises nitrogen.

14. The method of manufacturing the flash memory device of claim 1, wherein after the nitrogen atom-introducing treatment, the method further comprises performing an oxidation process.

15. The method of manufacturing the flash memory device of claim 14, wherein a gas utilized in the oxidation process comprises oxygen and nitrogen.

16. The method of manufacturing the flash memory device of claim 14, wherein the oxidation process is a thermal treatment.

17. The method of manufacturing the flash memory device of claim 16, wherein a temperature of the oxidation process is between 800° C. and 850° C.

* * * * *